United States Patent
Gaidis et al.

(10) Patent No.: US 9,318,698 B2
(45) Date of Patent: *Apr. 19, 2016

(54) SPIN TRANSFER TORQUE CELL FOR MAGNETIC RANDOM ACCESS MEMORY

(71) Applicant: INTERNATIONAL BUSINESS MACHINES CORPORATION, Armonk, NY (US)

(72) Inventors: Michael C. Gaidis, San Jose, CA (US); Janusz J. Nowak, Highland Mills, NY (US); Daniel C. Worledge, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/699,716

(22) Filed: Apr. 29, 2015

(65) Prior Publication Data

US 2015/0236252 A1      Aug. 20, 2015

Related U.S. Application Data

(60) Continuation of application No. 14/556,967, filed on Dec. 1, 2014, now Pat. No. 9,082,963, which is a division of application No. 13/168,477, filed on Jun. 24, 2011, now Pat. No. 8,928,100.

(51) Int. Cl.
| | |
|---|---|
| *H01L 21/00* | (2006.01) |
| *H01L 29/82* | (2006.01) |
| *H01L 43/12* | (2006.01) |
| *H01L 43/08* | (2006.01) |
| *H01L 43/02* | (2006.01) |

(52) U.S. Cl.
CPC ............ *H01L 43/12* (2013.01); *H01L 43/02* (2013.01); *H01L 43/08* (2013.01)

(58) Field of Classification Search
CPC ...................................................... H01L 43/12
See application file for complete search history.

(56) References Cited

U.S. PATENT DOCUMENTS

| 7,060,194 B2 | 6/2006 | Kodaira et al. |
| 7,810,228 B2 | 10/2010 | Yuasa et al. |

(Continued)

OTHER PUBLICATIONS

Huai, Y. "Spin-Transfer Torque MRAM (STT-MRAM): Challenges and Prospects" AAPPS Bulletin, vol. 18, No. 6. Dec. 2008. pp. 33-40.

(Continued)

*Primary Examiner* — Cuong Q Nguyen
(74) *Attorney, Agent, or Firm* — Tutunjian & Bitetto, P.C.; Vazken Alexanian

(57) ABSTRACT

Embodiments are directed to STT MRAM devices. One embodiment of an STT MRAM device includes a reference layer, a tunnel barrier layer, a free layer and one or more conductive vias. The reference layer is configured to have a fixed magnetic moment. In addition, the tunnel barrier layer is configured to enable electrons to tunnel between the reference layer and the free layer through the tunnel barrier layer. The free layer is disposed beneath the tunnel barrier layer and is configured to have an adaptable magnetic moment for the storage of data. The conductive via is disposed beneath the free layer and is connected to an electrode. Further, the conductive via has a width that is smaller than a width of the free layer such that a width of an active STT area for the storage of data in the free layer is defined by the width of the conductive via.

10 Claims, 4 Drawing Sheets

(56) References Cited

U.S. PATENT DOCUMENTS

| | | |
|---|---|---|
| 9,082,963 B2 * | 7/2015 | Gaidis et al. |
| 2009/0104718 A1 | 4/2009 | Zhong et al. |
| 2009/0108383 A1 | 4/2009 | Horng et al. |
| 2009/0174015 A1 | 7/2009 | Gu et al. |
| 2009/0257151 A1 | 10/2009 | Zhang et al. |
| 2010/0003767 A1 | 1/2010 | Cho |
| 2010/0074092 A1 | 3/2010 | Zhu et al. |
| 2010/0096716 A1 | 4/2010 | Ranjan et al. |
| 2010/0109106 A1 | 5/2010 | Zhong et al. |
| 2010/0177557 A1 | 7/2010 | Liu et al. |
| 2010/0177561 A1 | 7/2010 | Liu et al. |
| 2010/0193888 A1 | 8/2010 | Gu et al. |
| 2010/0219491 A1 | 9/2010 | Lee et al. |
| 2010/0240151 A1 | 9/2010 | Belen et al. |
| 2010/0258886 A1 | 10/2010 | Wang et al. |
| 2011/0014500 A1 | 1/2011 | Horng et al. |

OTHER PUBLICATIONS

Kishi, T., et al. "Lower-Current and Fast Switching of a Perpendicular TMR for High Speed and High Density Spin-Transfer-Torque MRAM" Electronic Devices Meeting (IEDM 2008). Dec. 2008. (4 Pages).

* cited by examiner

SPIN TRANSFER TORQUE CELL FOR MAGNETIC RANDOM ACCESS MEMORY

RELATED APPLICATION INFORMATION

This application is a continuation application of co-pending U.S. patent application Ser. No. 14/556,967, filed on Dec. 1, 2014, which is a divisional application of U.S. patent application Ser. No. 13/168,477, filed on Jun. 24, 2011, and has issued as U.S. Pat. No. 8,928,100. U.S. patent application Ser. No. 14/566,967 and U.S. patent application Ser. No. 13/168,477 are incorporated herein by reference in their entirety.

BACKGROUND

1. Technical Field

The present invention relates to magnetic random access memory devices and apparatuses, and more particularly to spin transfer torque cells for magnetic random access memory.

2. Description of the Related Art

Magnetic random access memory (MRAM) devices differ from conventional random access memory (RAM) in that data is stored through the use of magnetic elements as opposed to storing data through electric charges or current flows. In accordance with MRAM, two magnetic elements are separated by a barrier. In addition, one of the magnetic elements can be a permanent magnet set to a fixed polarity while the polarity of the other magnetic element is adaptable to store data. The different digital states (i.e. one or zero) can be differentiated by assessing whether the polarity of the two elements are the same or different. Data can be read by measuring the electrical resistance of the cell. For example, a transistor can switch a current through the cell such that charge carriers tunnel through the barrier in accordance with the tunnel magnetoresistance effect. The resistance of the cell is dependent on the magnetic moments of the two elements. Writing data in an MRAM can be conducted using a variety of methods. Spin transfer torque (STT), which employs a spin polarized current, is one such method.

In accordance with STT, the spin-polarized current is altered as it passes through the adaptable magnetic element, thereby applying a torque to the magnetic element and changing its polarity. Further, there are multiple types of STT MRAM devices. For example, reference layers and free layers of in-plane STT MRAMs have magnetic moments that are parallel to the wafer plane. Alternatively, reference layers and free layers of Perpendicular Magnetic Anisotropy (PMA) STT MRAMs have magnetic moments that are perpendicular to the wafer plane.

SUMMARY

One embodiment is directed towards an STT MRAM device. The device includes a reference layer, a tunnel barrier layer, a free layer and one or more conductive vias. The reference layer is configured to have a fixed magnetic moment. The tunnel barrier layer is configured to enable electrons to tunnel between the reference layer and the free layer through the tunnel barrier layer. The free layer is disposed beneath the tunnel barrier layer and is configured to have an adaptable magnetic moment for the storage of data. A conductive via is disposed beneath the free layer and is connected to an electrode. Further, the conductive via has a width that is narrower than a width of the free layer such that a width of an active STT area for the storage of data in the free layer is defined by the width of the conductive via.

An alternative embodiment is directed towards a computing apparatus that includes an STT MRAM device and a processor that is configured to utilize the STT MRAM device to perform computations. The device includes a reference layer, a tunnel barrier layer, a free layer and one or more conductive vias. The reference layer is configured to have a fixed magnetic moment. The tunnel barrier layer is configured to enable electrons to tunnel between the reference layer and the free layer through the tunnel barrier layer. The free layer is disposed beneath the tunnel barrier layer and is configured to have an adaptable magnetic moment for the storage of data. A conductive via is disposed beneath the free layer and is connected to an electrode. Further, the conductive via has a width that is narrower than a width of the free layer such that a width of an active STT area for the storage of data in the free layer is defined by the width of the conductive via.

Another embodiment is directed to a method for manufacturing an STT MRAM device. In accordance with the method, one or more conductive vias is formed on at least one first electrode. The method further includes depositing over the one or more conductive vias a magnetic tunnel junction stack such that a free layer that is configured to have an adaptable magnetic moment for storage of data is disposed between the one or more conductive vias and a tunnel barrier layer that is configured to enable electrons to tunnel between the free layer and a reference layer through the tunnel barrier layer. In addition, at least one second electrode is deposited over the magnetic tunnel junction stack to generate an MRAM device structure. Here, the one or more conductive vias has a width that is narrower than a width of the free layer such that a width of at least one active STT area for the storage of data in the free layer is defined by the width of the one or more conductive vias.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Prior to describing preferred embodiments in detail, certain potential problems that can be encountered during the manufacture and use of spin transfer torque cells are considered. For example, spin transfer torque cells of magnetic random access memory devices are difficult to scale and manufacture for a variety of reasons. Firstly, a conventional method of forming these types of devices is to use reactive ion etching (RIE) or ion milling to define a small rounded pillar made of several stacked magnetic layers. Usually, the etching process etches through all magnetic layers to define the size of the magnetic films in the device. As a result, edges of magnetic layers are distorted and exposed to poorly-controlled environments. This results in devices with magnetic and electric properties that are difficult to control with sufficient uniformity to yield large numbers of devices for memory applications.

Secondly, at the edges of reference layers in such pillars, strong magnetic dipole fields are present, causing a shift of free layer hysteresis. As such, these fields create undesired asymmetry in switching voltages and hinder bit stability. Furthermore, these unwanted stray fields have a complicated dependence on the stack structure and on temperature, which in turn further complicate design and manufacturing specifications.

Thirdly, it is very difficult to etch high-aspect ratio pillars for smaller scales of MRAM STT cells due to additional erosion of the hard mask material at these scales. For example, for pillars with diameters that are below 50 nm, it is difficult to form high aspect ratios that are sufficient to make a reliable connection to the top metal contacts without the top metal contact interfering with the desired flow of electrons through the STT MRAM device.

There are many challenges associated with etching small, high-aspect ratio pillars, especially considering that very large-scale integration (VLSI) production methods are optimized for forming long lines or rounded vias. Specific etch tools and etching methods dedicated solely to making small-diameter, high aspect ratio pillars are practically non-existing.

Figure 1:
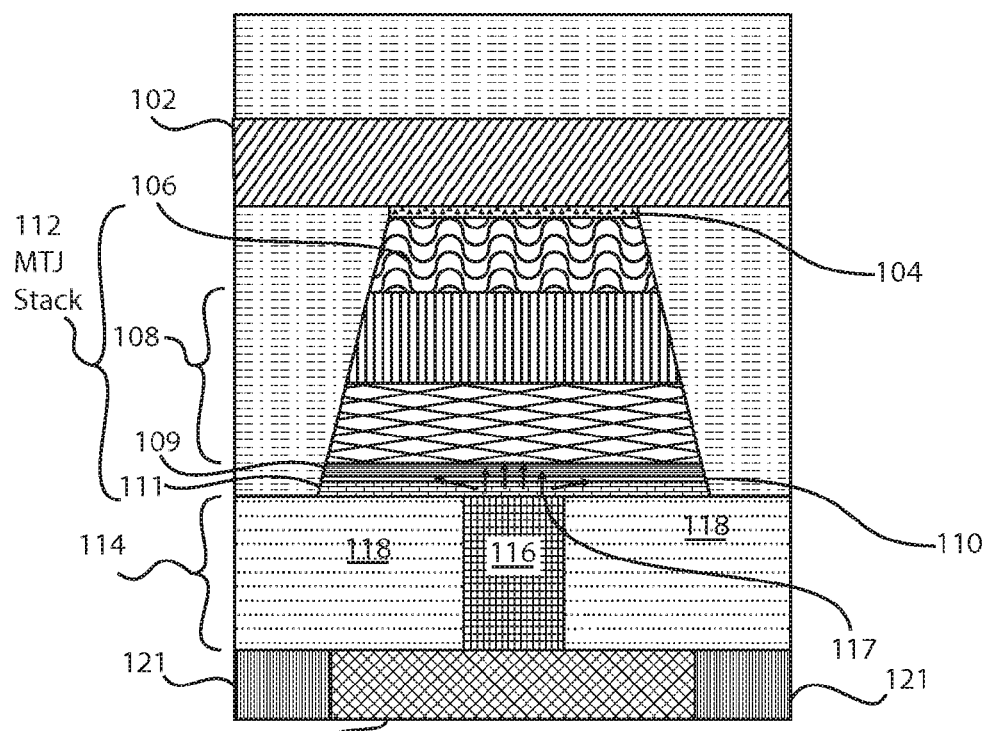
FIG. 1 is a block diagram of a cross-sectional view of an STT MRAM cell of a first embodiment of an MRAM device, where the cross-section is taken perpendicular to a device substrate surface.
Figure 2:
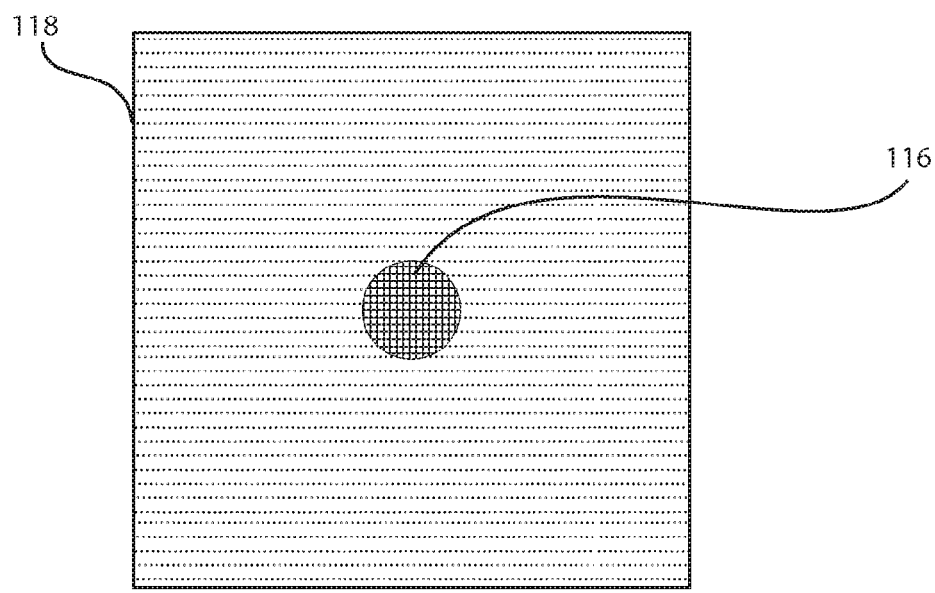
FIG. 2 is a block diagram of a cross-sectional, top-down view of a layer of an STT MRAM cell of the first embodiment of an MRAM device, where the cross-section is taken parallel to a device substrate surface.

Exemplary embodiments of the invention are directed to a novel PMA and in-plane STT MRAM cell which avoids all of the above-mentioned problems. In particular, embodiments overcome these problems by enabling the control of the location and size of the active spin transfer torque area of the cell independently of the width of layers of a magnetic tunnel junction (MTJ). Here, the active spin transfer torque area can be defined by the size of a conductive via located underneath a free layer of the MTJ stack. FIGS. 1 and 2 illustrate an example of an STT MRAM cell 100 in accordance with the present principles. The STT MRAM cell 100 can be configured as a PMA STT MRAM cell or as an in-plane STT MRAM cell.

As depicted in FIG. 1, in accordance with one aspect, the conductive via 116 can be disposed underneath the free layer(s) 110 of an MTJ stack 112. The MTJ stack 112 includes reference layer(s) 108, tunnel layer(s) 109 and free layer(s) 110. The MTJ stack 112 may further include a hard mask layer(s) 106 and also a seed layer(s) 111 beneath the free layer 110. A conventional MTJ stack is usually configured such that the reference layer and tunnel barrier are disposed beneath the free layer. The MTJ stack 112 can be generated by inverting a conventional MRAM stack and placing the free layer 110 beneath the tunnel barrier 109. Here, the arrangement of the MTJ stack and the use of the conductive via 116 are designed with appropriate device film resistances to result in current flow through the tunnel barrier 109 region atop the conductive via 116 that is enhanced relative to the current flow in tunnel barrier regions not directly atop conductive via 116. The configuration of the cell permits the physical size of the magnetic layers 108, 110 and the tunnel barrier 109 of the MTJ stack 112 to be wider than the active STT area of the cell. In other words, the conductive via 116 has a cross-sectional area (parallel to the substrate surface) that is smaller than the corresponding cross-sectional area of the free layer such that the area of an active STT region for the storage of data in the free layer is determined by the area of the conductive via. Here, all the magnetic layers 108, 110 and the tunnel barrier 109 of the MTJ stack are located above the conductive via, which forms the bottom contact for the magnetic layers. The layers between the tunnel barrier 109 and conductive via 116 should be chosen relative to the tunnel barrier conductance such that material properties, material thicknesses, and process treatments of these layers create a sufficiently non-uniform current flow through the tunnel barrier, as described in more detail herein below.

It should be noted that exemplary materials for the conductive via(s) 116 include Cu, Ta, Ti, Ru, and W, while exemplary materials for the free layer(s) 110 include alloys and/or multilayers of Fe, Ni, Co, Cr, V, Mn, Pd, Pt, B, O and/or N. Further, although the via(s) 116 are cylindrical in shape and have a circular cross-sectional area in the embodiments described herein, the via(s) 116 and the cross-sectional area of the via(s) 116 can be any shape and can be different for different vias 116. Additionally, the hard mask 106 can be made of Ru, Ta, Ti, TaN, TiN, Cu, Si, Al, or multilayers formed from these materials, and the reference layer(s) 108 can be composed of alloys and/or multilayers of Fe, Ni, Co, Cr, B, Mn, Pt, Pd, Ru, Ta, W and/or Cu. Moreover, the tunnel barrier layer 109 can be composed of MgO, $Al_2O_3$, $TiO_2$, or materials of higher electrical tunnel conductance, such as semiconductors or low-bandgap insulators. In applications where high tunnel magnetoresistance is not required, conventional giant magnetoresistance (GMR) films can be used in place of the more resistive tunnel barriers described above.

As indicated above, the configuration of the cell 100 enables the control of the location and size of the STT active area independently of the width of the layers, permitting the use of magnetic layers that are wider than the active STT region. This aspect has several advantages over conventional MRAM cells. For example, use of wider layers in this manner minimizes the effect on the free layer of stray fields emanating from edges of reference layers. Accordingly, complicated reference layers of certain conventional cell architectures need not be utilized to compensate for the stray fields. Further, edges of the magnetic layers that are negatively affected by the etching or encapsulation process are eliminated from the active STT region. Moreover, the stability of the reference layers is improved due to their larger sizes. In addition, the use of a smaller active STT region in this manner better matches the tunnel resistance of the device and the size of a transistor used for this scale. Furthermore, the manufacture of the MRAM device is simplified. For example, the smallest size (cell diameter) in the cell is a conductive via, which is much easier and cost-effective to construct in comparison to conventional fabrication of an MRAM pillar. The top contact to the device is also easier to implement due to the larger width of the top-most layer. Additionally, the magnetic anisotropy in active and non-active regions of the free layer can be controlled by the appropriate selection of the materials used and of the chemical-mechanical planarization (CMP) processes conducted at the bottom contact surface.

It should also be noted that controlling the location and size of the STT active area independently of the width of the MTJ layers can obviate the need to etch pillars to generate STT cells. For example, as discussed in more herein below, portions of the free layer can be configured to be non-conductive.

As such, separate tunnel devices need not be created. Here, the manufacture of MRAM devices can be significantly simplified, as extra lithography masks need not be applied to pattern the MTJ.

Aspects of the present invention are described below with reference to flowchart illustrations and/or block diagrams of methods, apparatus (systems) and devices according to embodiments of the invention. The flowchart and block diagrams in the Figures illustrate the architecture, functionality, and operation of possible implementations of methods, apparatus (systems) and devices according to various embodiments of the present invention. It should also be noted that, in some alternative implementations, the functions noted in the block may occur out of the order noted in the figures. For example, two blocks shown in succession may, in fact, be performed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose systems that perform the specified functions or acts.

It is to be understood that the present invention will be described in terms of a given illustrative architecture utilizing a wafer substrate; however, other architectures, structures, substrate materials and process features and steps may be varied within the scope of the present invention.

It will also be understood that when an element described as a layer, region or substrate is referred to as being "on" or "over" another element, it can be directly on the other element or intervening elements may also be present. In contrast, when an element is referred to as being "directly on" or "directly over" another element, there are no intervening elements present. Similarly, it will also be understood that when an element described as a layer, region or substrate is referred to as being "beneath" or "below" another element, it can be directly beneath the other element or intervening elements may also be present. In contrast, when an element is referred to as being "directly beneath" or "directly below" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an STT MRAM device may be created in a graphical computer programming language, and stored in a computer storage medium (such as a disk, tape, physical hard drive, or virtual hard drive such as in a storage access network). If the designer does not fabricate STT MRAM devices or lithographic masks used to fabricate STT MRAM devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of lithographic masks, which typically include multiple copies of the STT MRAM design in question that are to be formed on a wafer. The lithographic masks can be utilized to define areas of the wafer (and/or the layers thereon) to be etched or otherwise processed.

Methods as described herein may be used in the fabrication of STT MRAM devices. The resulting devices can be distributed by the fabricator in raw wafer form (that is, as a single wafer that has multiple unpackaged devices), as a bare die, or in a packaged form. In the latter case the device is mounted in a single package (such as a plastic carrier, with leads that are affixed to a motherboard or other higher level carrier) or in a multichip package (such as a ceramic carrier that has either or both surface interconnections or buried interconnections). In any case the device is then integrated with other chips, discrete circuit elements, and/or other signal processing devices as part of either (a) an intermediate product, such as a motherboard, or (b) an end product. The end product can be any product that includes the STT MRAM device, ranging from toys and other low-end applications to advanced computer products having a display, a keyboard or other input device, and a central processor.

Figure 3:
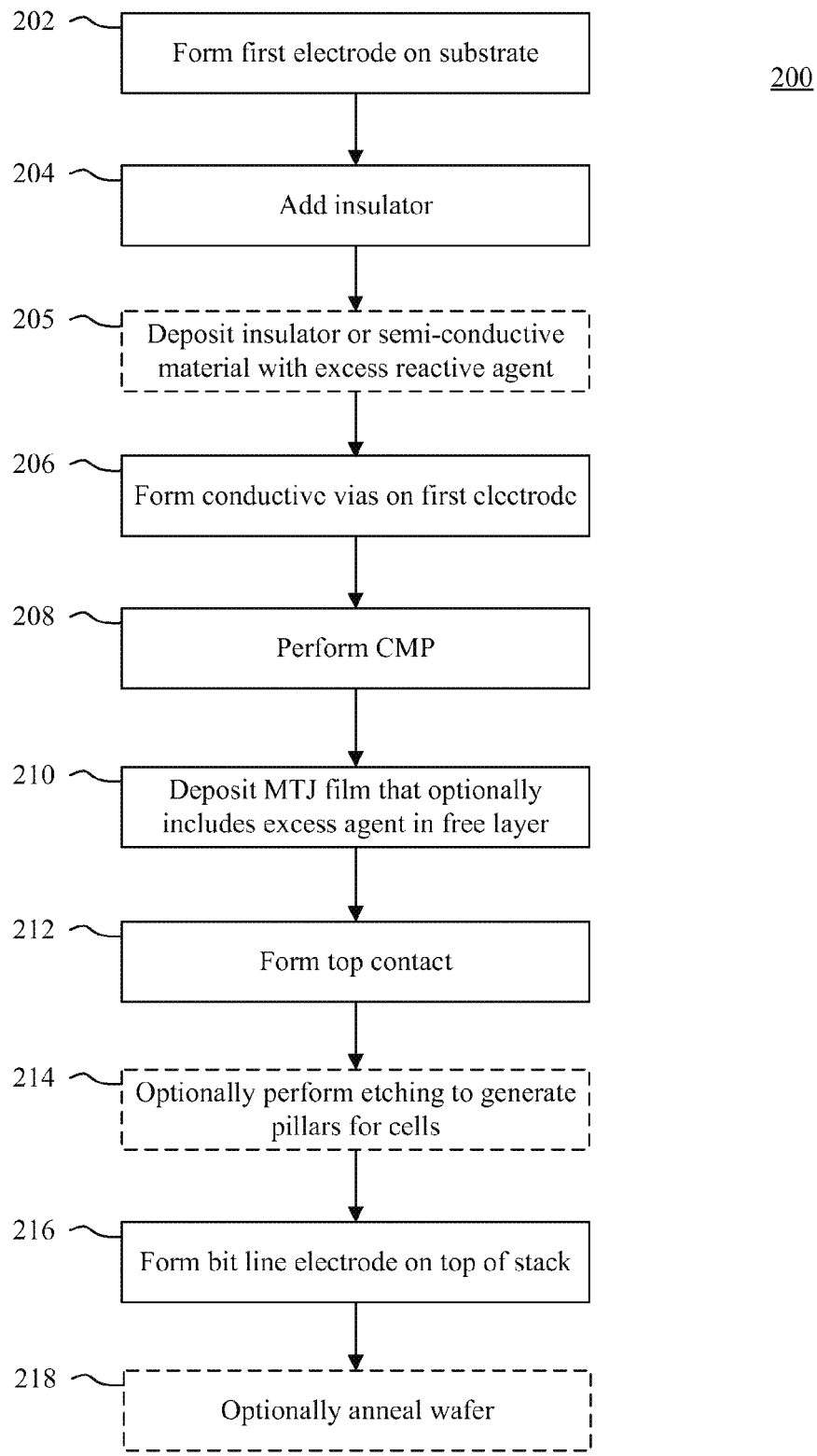
FIG. 3 is a flow diagram of an embodiment of a method for manufacturing an STT MRAM cell.

Referring now to FIG. 3 with continuing reference to FIGS. 1 and 2, a method 200 for generating an STT MRAM device/apparatus in accordance with an exemplary embodiment of the present invention is illustrated. As indicated above, for conventional STT MRAM cells, the size of the pillar and the magnetic layers is the most critical dimension that determines the device resistance and current utilized to switch the device. As also indicated above, the resistance of an STT MRAM cell in accordance with aspects of the present principles is determined by the diameter (which is referred to herein as a 'width') or area of an underlying conductive via 116 and its effect on the tunnel barrier 109.

The method 200 can begin at step 202, at which a first electrode(s) 120 is formed on a substrate (not shown). The first electrode(s) 120 can be metallic layers M1 or M2 of CMOS (complementary metal-oxide-semiconductor) circuitry or directly a drain or a source of select transistor(s) which are controlled by a word line(s). The first electrodes 120 can be implemented as square islands such that each cell has a different electrode 120. As part of the forming step 202, an interlayer insulator 121 can be formed between first electrodes 120 of different cells. At step 204, an insulator 118 can be added on top of the first electrode(s) and the interlayer insulator 121. The insulator 118 can be patterned on the first electrode(s) and the insulator 121 to include a grid (or other configuration) of holes using an appropriate mask.

At step 206, conductive vias 116 are formed on the first electrode(s) 120, which can be a drain or a source of a select transistor. For example, the conductive material of the vias can fill the holes of the insulator 118. For example, the vias can be composed of Ta, W, Cu and/or other alloys that are used to form conductive vias. Here, the area 117 of the top of the via 116 defines the STT active area or region of the corresponding cell. The insulator 118 and the conductive vias 116 form a layer 114. A cross-sectional, top view of layer 114 is provided in FIG. 2. At step 208, CMP can be performed on the layer 114 (or on layer 115 in other embodiments described below). The CMP should be performed on the surface of the layer 114 (or on layer 115) to a quality and flatness such that an operable tunnel barrier is formed, even at the edges of the via 116 and the interlayer dielectric (ILD) 118. It should be noted that the formation of conductive vias 116 in a field of insulator 118 can be realized by the process described above, which comprises initially depositing insulator 118, defining holes for vias 116, filling the vias 116 with conductive material and exercising CMP to remove the overburden of the deposited conductive material. Alternatively, the formation can be realized in an inverse fashion. For example, the formation can include initially depositing a conductive material with well-defined etch and polish properties, patterning this conductive material into easily-defined pillars, depositing insulator film 118 and finally exercising CMP to remove the overburden of the insulating material to expose conductive material 116. The inverse process involves patterning of a pillar structure with a very small width. Although it is subject to the difficulties mentioned above with regard to patterning MTJ device pillars, the choice of material 116 can be quite flexible and can be made with particular focus on the ease of etching to define such structures. The choice of the materials for the via 116 can also be based on the behavior as a CMP polish stop to permit the use of conductive pillars 116 with relatively low aspect ratios that are easier to create than the high-aspect-ratio MTJ devices.

At step 210, an MTJ film 112 can be deposited on the CMP surface of the layer 114 (or layer 115). As stated above, the MTJ film 112 can be formed by inverting a conventional MTJ film stack by placing the free layer 110 at the bottom portion of the stack. For example, a tunnel stack, comprising reference layer(s) 108, a tunnel barrier 109 and free layer(s) 110, can be formed directly on the CMP surface or on an optional seed layer 111, which can be, for example, less than 2 nm. Preferably, the cell 100 is fabricated without the seed 111, or with a very thin or poorly-conducting film that restricts current spreading. The optional seed 111 can be composed of Ta, Ti, Al, Mg, Hf, B, Si and/or their alloys. As indicated above, in the MTJ film 112, the free layer 110 can be disposed directly above the optional seed 111. The optional seed 111 and the free layer 110 are below the tunnel barrier layer 109 and should be poorly conductive with respect to the tunnel barrier conductivity, to minimize lateral currents. This can be achieved through advantageous materials choices, limitation of the film thicknesses, or chemical modification of film properties outside the desired active STT region, as will be described below. The whole MTJ stack 112 with the hard mask (HM) 106 can be deposited on the CMP-prepared surface. In accordance with one exemplary aspect, the free layer 110, which can be less than 10 Å in thickness, can be deposited directly on top of the CMP surface, which has a conductive via 116 in the center of each cell. If the free layer 110 is less than 10 Å thick, the resistance per square ($R_{sq}$) or sheet resistance for the free layer can be well above the tunnel barrier resistance times the device area (RA) product. As a result, electrical current flow is concentrated in the region through the tunnel barrier immediately above the via 116. The active STT area is essentially determined by the width of the via below the free layer 110, thereby permitting the widths of each of the layers of the MTJ stack 112 above the conductive via to be wider than the width of the conductive via 116. The dependence of the active STT area on the width of the via 116 nullifies the influence of the exact widths of each of the layers of the MTJ stack 112 above the conductive via 116 on the MRAM device. The $R_{sq}$ values of all the layers below the tunnel barrier should be sufficiently large compared to the resistance-area product of the tunnel barrier to keep the active STT region small. For example, if the RA product for the tunnel barrier 109 is 5 $\Omega \cdot \mu m^2$, then $R_{sq}$ of the films between the via 116 and the barrier 109 should be greater than about 10 k$\Omega$ to keep the effective STT active radius within 10 nm of the via radius. This approximates a value of $R_{sq}$ that makes the spreading current less than $1/10^{th}$ of the tunnel current. This $R_{sq}$ scales linearly with RA and inversely with allowed growth radius, independent of via size to first order. To keep the growth radius small, one should utilize low-RA barriers and high $R_{sq}$ free layer and seed layer films. Because one can relax the dimensions of the difficult-to-etch magnetic films, the aforementioned process significantly improves the manufacturability STT MRAM devices in comparison to conventional designs. For example, ultra-small vias (e.g., a width of less than 50 nm) beneath the MTJ stack and throughout a dielectric layer 118 are considerably easier to fabricate than pillars of the same width which contain magnetic films and are of high aspect ratio.

At step 212, the top contact 104 can be formed above the MTJ film. Here, the contact can be composed of Ta, TaN, Ru and/or W and/or multilayers thereof. At optional step 214, etching can be performed to generate pillars for the cells of the MRAM device or apparatus. For example, reactive ion etching can be performed, as described above. However, here, a pillar with a relatively large area or width can be formed. The size of the MTJ pillar should be large enough to decrease the dipole fields to acceptable levels and to separate the RIE erosion area from the active STT region. The ratio between the width of the MTJ pillar and the width of the one or more conductive vias 116 depends on the $R_{sq}$ of the portions of the free layer 110 that are outside the active STT region. Preferably, this ratio should be in the range of 1.2-5.0. Here, the scalability of the design is a significant improvement over conventional MRAM designs, as the effects of edge damage and edge stray fields on the active STT region are reduced. Typically, the etch damage region is a few nanometers thick. However, for some stack types, the etch damage region can be as large as 30 nm. Etch damage of magnetic layers is associated with grain boundary oxidation, intermixing of materials between layers and physical displacement of atoms in the as-deposited polycrystalline lattice. It should be further noted that thermal stability of conventional MRAM devices is typically limited by processes occurring at the film edges. By removing these edges from the active STT area with the processes described herein, one enhances the thermal stability of the device. This is of substantial benefit to the commercialization of MRAM devices, as it can make MRAM processing compatible with standard semiconductor industry processing.

At step 216, a bit line electrode can be formed on top of the resulting stack to complete the structure of the MRAM device. Here, the bit line can correspond to electrode(s) 102. In addition, an etching operation can be formed to generate the bit lines. It should be noted that in FIGS. 1 & 4 and in accordance with the method 200, the electrode 102 runs from left to right of the drawing sheet.

Figure 4:
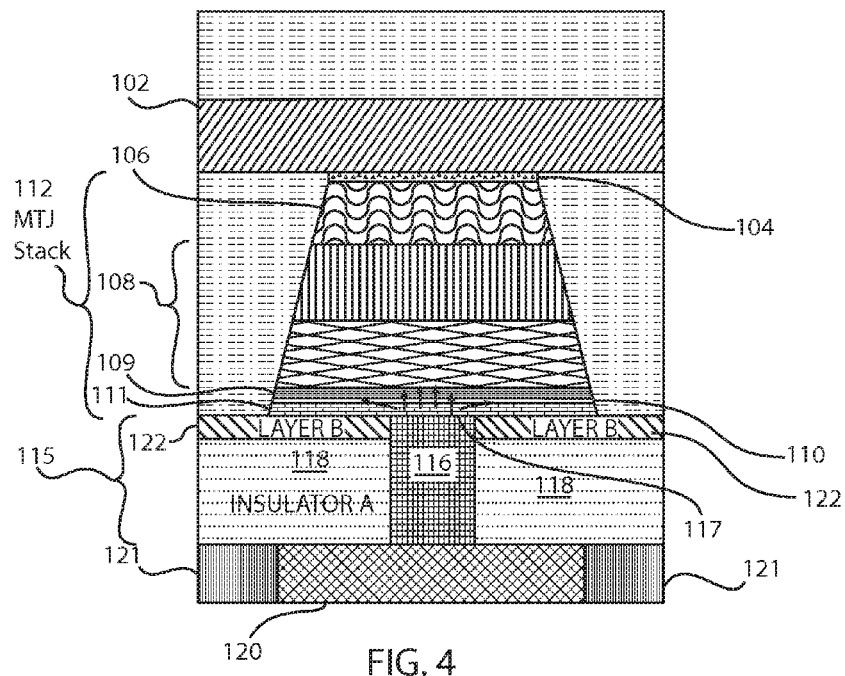
FIG. 4 is a block diagram of a cross-sectional view of an STT MRAM cell of a second embodiment of an MRAM device.
Figure 5:
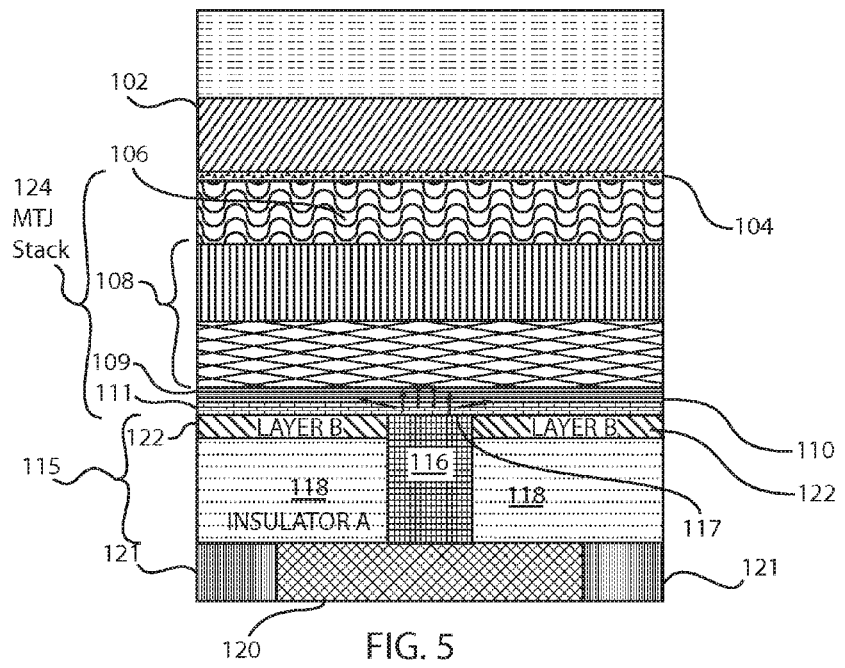
FIG. 5 is a block diagram of a cross-sectional view of an STT MRAM cell of the third embodiment of an MRAM device.

Referring to FIGS. 4-5, with continuing reference to FIGS. 1-3, as described above, the $R_{sq}$ of all the layers of the MTJ stack 112 below the tunnel barrier 109 should be much larger than the RA product for the tunnel barrier 109. In accordance with one exemplary aspect, the layers of the MTJ stack 112 below the tunnel barrier 109 should be practically non-conductive. To achieve such a high resistivity of the layers of the MTJ stack 112 below the tunnel barrier 109, the MRAM device or apparatus can be configured such that another insulating layer or semiconductive layer B 122 can be deposited on top of insulating layer A 118, thereby forming a layer 115. As such, the method 200 can be performed as described above and can include a step 205, at which an insulator or a semiconductive material 122 including an excess reactive agent can be deposited over the insulator 118. The layer B 122 can deliver the reagent to complete a chemical reaction between free layer 110 and the layer B 122 described in more detail herein below. Layer B 122 can be made of an insulator or a semiconductor with an excess of oxygen and/or one or more of other elements, such as N, S, F, Cl.

After completing manufacturing process, the resulting wafer structure can be annealed at step 218. Here, the annealing step 218 can be conducted at certain temperatures, for example 200° C.-450° C., for a specific time from few minutes to few hours, depending on the materials used. For example, low temperature TEOS (Tetraethyl orthosilicate)

including excess of oxygen can be deposited at 200° C. at step 205 and the annealing step 218 can be conducted at higher temperatures of 300° C.-400° C. for a duration of one hour. Semiconductive or insulating compounds, for example, Co, Fe, B, can be used as the material for layer B 122 and specific reagents for layer B 122 can be, for example, O, N, F, B, P and/or S. The annealing of these materials induces a chemical reaction between the free layer 110 and the layer B 122 such that the portions of the free layer that are above the layer B 122 and are below the barrier are rendered non-conductive. The reaction will also be implemented at the seed layer 111, if utilized. For example, as a result of the reaction completed during wafer annealing at step 218, the portion of the free layer 110 (and also the seed layer 111, if used) above the layer B 122 can be made to be fully non-conductive and non-magnetic while the portion of the free layer 110 (and the seed layer 111, if used) above the conductive via 116 will remain conductive and magnetic so as to permit writing and reading of data at this portion.

In accordance with an alternative embodiment, the annealing step 218 can transform the portion of the free layer 110 above the conductive via 116 by converting the portion into a non-resistive state. For example, in this embodiment, the method can be performed as described above. However, step 205 can be omitted such that the final device includes cells that are configured as depicted in FIG. 1, with or without the seed layer 111, or includes cells that are configured as depicted in FIG. 5, described in more detail below, without the layer 122 (i.e., layer 114 is included in the cell of FIG. 5 in lieu of layer 115) and without the seed layer 111. Further, at step 210, an MTJ stack including a free layer that has an excess reactive agent, such as oxygen, can be deposited over the layer 114. Accordingly, the free layer 110 is initially relatively non-conductive. The annealing step 218 can cause the via 116 to absorb the reactive agent from the free layer 110, thereby rendering the portion of the free layer 110 above the via 116 to be conductive relative to the portions of the free layer that are not above the conductive via 116. The conductive via 116 can be made of Ta, which facilitates this effect and retains sufficient conductivity to permit storage and reading operations on the MRAM cell.

Transforming the free layer 110 (and the seed layer 111) below the barrier to have non-conductive portions, or, alternatively, to have a conductive portion above the via, as described above, provides substantial advantages and significantly simplifies the manufacturing process. In particular, separate tunnel devices do not need to be pattered in the layers. For example, the etching step 214 and the creation of pillars need not be performed. Rather, the whole MTJ stack can be beneath the bit lines.

For example, in accordance with the embodiment illustrated in FIG. 5, the orientation of the view as compared to FIGS. 1 and 4 is rotated such that the electrode(s) 102 runs into and out of the drawing sheet. Here, the omission of step 214 and the performance of step 216, in which the bit lines 102 can be etched, results in a continuous MTJ stack 124 that is underneath and follows the bit line 102. In other words, the MTJ stack 124 is continuous over a plurality of other conductive vias that are underneath the bit line 102 and that are in a common plane with the via 116 in the MRAM device or apparatus. In one preferred embodiment, the MTJ stack 124 is etched along with an etching process to define the conductive bit line 102. The continuity feature of the MTJ stack 124 is also present below other corresponding bit lines 102. The annealing of the free layer 110 as described above, using layer 122 or using a free layer 110 with an excess agent, prevents horizontal current flow between active areas in the free layer of the MRAM device or apparatus (i.e., between portions of the free layer directly above the conductive vias). Similarly, if the seed layer 111 and layer 122 are used, the annealing step 218 would prevent horizontal current flow between regions of the seed layer above the conductive via 116, as the annealing step 218 would render these regions non-conductive and non-magnetic.

Obviating the need to generate separate tunnel devices in this way greatly simplifies the manufacturability of the MRAM devices, as extra lithography masks need not be utilized to pattern MTJs. This aspect also permits a substantial scale-down of MRAM devices. For example, the embodiments described herein can be employed to scale MRAM devices to smaller and smaller nodes, with significantly smaller transistors and smaller active STT areas. In contrast, the problems of conventional designs described above worsen as the device is scaled down.

With regard to the resulting MRAM device or apparatus produced in accordance with the method 200, it should be noted that for "1" and "0" states, there can be different magnetic configurations in the free layer 110, depending on the degree of conversion of the portions of the free layer outside the active STT area to a non-conductive state. Usually, oxides of ferromagnetic layers are semiconductive and non-ferromagnetic. In embodiments described above, the free layer 110 will have a magnetic moment only in active STT region. However, in another embodiment only a part of free layer 110 can be converted to an oxide and will be non-magnetic. The un-oxidized portion(s) of the free layer that are not above the vias 116 may have a different anisotropy. In this case, a circular domain in the active area of the cell can be created to form a "1" or "0" state. The opposing state can be formed by a parallel magnetic moment between the reference layer(s) and the portions of the free layer 110 above the vias 116.

It should be understood that the illustrations of FIGS. 1, 4 and 5 depict a cross-section of a single cell in an MRAM device. The device can include a plurality of such cells and a plurality of conductive vias 116, where each via is included in a common plane or layer of the device, such as layer 114 or layer 115, and where each cell can include a different conductive via 116. For example, the cells can be oriented in a grid-structure. As indicated above, one or more cells can be defined by an etched pillar, as in FIGS. 1 and 4. Alternatively, one or more cells can be defined simply by the conductive vias in embodiments in which etching is not employed to construct pillars and one or more of the layers of the MTJ stack 112 is continuous over a plurality of conductive vias, as indicated in FIG. 5. Further, it should also be understood that references to "width" herein refer to sizes of elements along the horizontal directions of FIGS. 1, 4 and 5. Moreover, it should also be understood that references to "width" of an element herein refer to the extent of the element from any cross-sectional viewing angle parallel to the substrate. In addition, references to "thickness" herein refer to sizes of elements along the vertical direction of FIGS. 1, 4 and 5.

Figure 6:
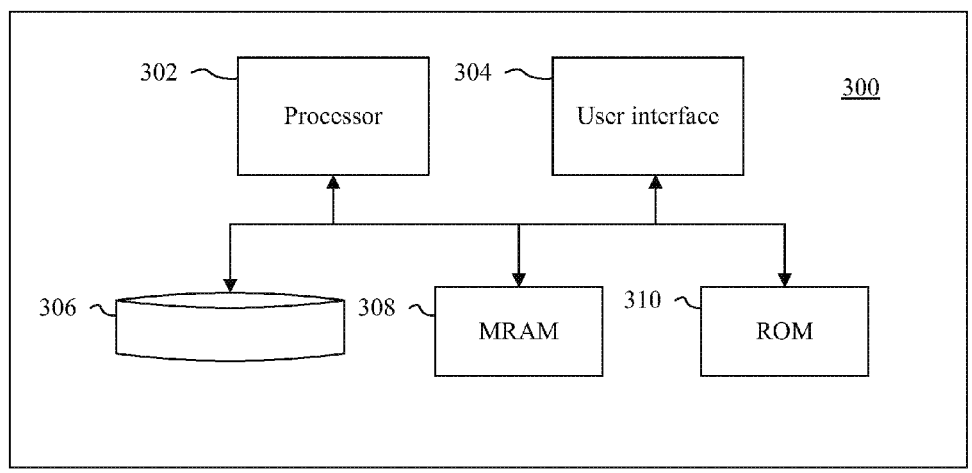
FIG. 6 is a block diagram of a computing apparatus including an MRAM device according to the present principles.

It should be further understood that STT MRAM devices according to the present principles can be employed in any computing apparatus that utilizes RAM. For example, such computing apparatuses can utilize the STT MRAM devices in lieu of or in addition to RAM. Such computing apparatuses can include personal computers, mainframes, laptops, smart phones, tablet computers and other computing devices. FIG. 6 depicts a block diagram of an exemplary computing apparatus 300 that employs STT MRAM devices according to the present principles. The computing apparatus can include a processor 302 that can store and utilize data in an MRAM 308 according to the present principles to perform computations.

The apparatus can further include a hard disk drive 306, read only memory (ROM) 310 and a user-interface 304, which can comprise a keyboard, a touch screen, etc.

Having described preferred embodiments of STT MRAM devices, apparatuses and manufacturing methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for manufacturing spin transfer torque (STT) magnetic random access memory (MRAM) device comprising:
    forming at least one conductive via on at least one first electrode;
    depositing over the at least one conductive via a magnetic tunnel junction stack such that a free layer that is configured to have an adaptable magnetic moment for storage of data is disposed between the at least one conductive via and a tunnel barrier layer that is configured to enable electrons to tunnel between the free layer and a reference layer through the tunnel barrier layer; and
    depositing at least one second electrode over the magnetic tunnel junction stack to generate an MRAM device structure.

2. The method of claim 1, further comprising
    adding an insulator between the free layer and the electrode such that the at least one conductive via is disposed laterally to the first insulator; and
    depositing a material between the first insulator and the free layer.

3. The method of claim 2, further comprising:
    applying a chemical-mechanical planarization process on a surface of the at least one conductive via.

4. The method of claim 2, wherein the material includes at least one excess agent selected from the group consisting of elements from the thirteenth, fifteenth, sixteenth and seventeenth columns of the periodic table of elements.

5. The method of claim 2, further comprising:
    annealing the MRAM device structure to cause the material to react with the free layer to increase the resistivity of portions of the free layer that are above the material.

6. The method of claim 5, wherein the annealing transforms the portions of the free layer that are above the material to be non-conductive and non-magnetic.

7. The method of claim 5, wherein the annealing is performed at a first temperature between 200° C. and 450° C. and wherein the depositing the material is performed at a second temperature that is lower than the first temperature.

8. The method of claim 1, wherein the free layer includes an excess agent and wherein the method further comprises:
    annealing the MRAM device structure to cause the at least one conductive via to absorb the excess agent and to increase the conductivity of a portion of the free layer that is above the at least one conductive via.

9. The method of claim 1, further comprising:
    etching through the magnetic tunnel junction stack to generate a plurality of cells such that each of the conductive vias is included in a different cell and each of the cells is defined by a separate pillar, wherein each of the pillars includes a separate stack of the reference layer, the tunnel barrier layer and the free layer.

10. The method of claim 1, wherein the depositing the magnetic tunnel junction stack comprises depositing the free layer directly on the at least one conductive via.

* * * * *